United States Patent
Kwong et al.

(10) Patent No.: US 11,495,279 B1
(45) Date of Patent: Nov. 8, 2022

(54) MANAGING WRITE DISTURB FOR UNITS OF MEMORY IN A MEMORY SUB-SYSTEM USING A RANDOMIZED REFRESH PERIOD

(71) Applicant: Micron Technology, Inc., Boise, ID (US)

(72) Inventors: Charles See Yeung Kwong, Redwood City, CA (US); Seungjune Jeon, Santa Clara, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/402,984

(22) Filed: Aug. 16, 2021

(51) Int. Cl.
 *G11C 11/406* (2006.01)
 *G11C 29/42* (2006.01)
 *G11C 11/4096* (2006.01)

(52) U.S. Cl.
 CPC .... *G11C 11/40622* (2013.01); *G11C 11/4096* (2013.01); *G11C 11/40615* (2013.01); *G11C 29/42* (2013.01)

(58) Field of Classification Search
 CPC .................................................... G11C 11/406
 USPC ........................................................... 365/222
 See application file for complete search history.

(56) References Cited

U.S. PATENT DOCUMENTS

| 10,950,317 B2 * | 3/2021 | Muchherla | G06F 3/061 |
| 2012/0230114 A1 * | 9/2012 | Sekine | G11C 11/5628 365/185.18 |

\* cited by examiner

*Primary Examiner* — Muna A Techane
(74) *Attorney, Agent, or Firm* — Lowenstein Sandler LLP (57) ABSTRACT

A write operation performed on a first memory unit of a memory device is detected, wherein the first memory unit comprises one or more memory cells. Responsive to detecting the write operation, a value of a counter associated with the first memory unit is incremented. It is determined whether the value of the counter satisfies a threshold criterion, wherein the threshold criterion is based on a random or pseudo-random number within a defined range. Responsive to determining that the value of the counter satisfies the threshold criterion, a refresh operation is performed on a second memory unit.

20 Claims, 6 Drawing Sheets

MANAGING WRITE DISTURB FOR UNITS OF MEMORY IN A MEMORY SUB-SYSTEM USING A RANDOMIZED REFRESH PERIOD

TECHNICAL FIELD

Embodiments of the disclosure relate generally to memory sub-systems, and more specifically, relate to managing write disturb for units of memory in a memory sub-system using a randomized refresh period.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Aspects of the present disclosure are directed to managing write disturb for units of memory of a memory sub-system using a randomized refresh period. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Another example of non-volatile memory devices is a three-dimensional cross-point ("3D cross-point") memory device that is a cross-point array of non-volatile memory that can perform bit storage based on a change of bulk resistance, in conjunction with a stackable cross-gridded data access array. Other examples of non-volatile memory devices are described below in conjunction with FIG. 1. A non-volatile memory device is a package of one or more dies. Each die can consist of one or more planes. For some types of non-volatile memory devices (e.g., NAND devices and 3D cross-point devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can be made up of bits arranged in a two-dimensional or three-dimensional grid. Memory cells are etched onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form a plane of the memory device in order to allow concurrent operations to take place on each plane. The memory device can include circuitry that performs concurrent memory page accesses of two or more memory planes. For example, the memory device can include a respective access line driver circuit and power circuit for each plane of the memory device to facilitate concurrent access of pages of two or more memory planes, including different page types.

The memory device can include one or more units of memory. Each memory unit can include one or more memory cells (e.g., a page, a block, or some other translation unit (TU)). In certain memory devices, when data is written to a memory unit, adjacent (e.g., contiguous, neighboring, nearby, next to, etc.) memory units can experience what is known as "write disturb." Write disturb is the result of continually writing data to a particular memory unit without writing and/or refreshing data stored at nearby memory units, causing the nearby memory units to change state over time (e.g., the programmed state changes). If too many write operations are performed on the particular memory unit (also referred to as the "aggressor" hereinafter), data stored at adjacent or proximate memory units (also referred to as the "victim" hereinafter) of the memory device can become corrupted or incorrectly stored. The heat generated from the aggressor unit during the write operations can cause the memory alloy of the victim unit to crystalize, degrading its quality. Thus, in traditional memory sub-systems, a higher error rate can result when reading the data stored at the adjacent or proximate memory units. The higher error rate (e.g., raw bit error rate, or RBER) can increase the use of an error detection and correction operation (e.g., an error correction operation) for subsequent operations (e.g., read and/or write) performed on the memory unit. The increased use of the error correction operation can result in a reduction of the performance of the conventional memory sub-system. As more resources of the memory sub-system are used to perform the error control operation, fewer resources can be used to perform other read operations or write operations. Thus, the performance of the memory sub-system can be decreased as fewer read operations and write operations can be performed within a particular amount of time.

To mitigate the effects of write disturb on data stored at the memory sub-system, certain memory sub-systems typically utilize various write refresh processes. For example, certain memory sub-systems can perform a refresh operation based on a number of write operations performed on a memory unit. Typically, the memory sub-system stores the number of write operations performed on units of the memory device as metadata on the memory device. For every write operation that is performed on a particular memory unit, the memory sub-system increments a counter by one. When the counter reaches some predefined threshold number of write operations (e.g., 512 write operations), the memory sub-system can perform a refresh operation on the data of victim memory units. The refresh operation can typically include reading the data of the victim memory units, performing an error correction operation on the data, and writing back the data to the victim memory units. Once the refresh operation is performed, the memory sub-system can reset the counter to an initial value and then restart the process. Thus, the memory sub-system performs a refresh operation at a constant period (e.g., every 512 write operations). However, this solution to write disturb can lead to a further decrease in the performance of the memory sub-system. In particular, this solution can result in oscillating behavior in the memory device. For example, if write operations are performed alternatively on two aggressor memory units of the memory device, it is possible that the memory sub-system performs a refresh operation on the victim memory units of only one of the two aggressor memory units. For example, if the predefined threshold number of write operations is 512 write operations and the memory sub-system performs write operations on the two aggressor memory units alternatively, the $512^{th}$ write operation will typically be performed on the same aggressor memory unit every time. Thus, the memory sub-system would only perform refresh operations for the victim memory units of the aggressor memory unit associated with the $512^{th}$ write operation and would fail to perform refresh operations on the victim memory units of the other aggressor memory unit.

In another example, certain memory sub-systems can perform a refresh operation based on a random or pseudo-random number of write operations. Typically, the memory sub-system stores the number of write operations performed on a particular memory unit as metadata on the memory device. For every write operation that is performed on a particular memory unit, the memory sub-system increments a counter by one. For every write operation, the memory sub-system also generates a random or pseudo-random number. If the random or pseudo-random number is less than or equal to some predefined threshold number of write operations (e.g., 512 write operations), the memory sub-system can perform a refresh operation on the data of victim memory units. This solves the oscillating behavior discussed in the existing solution above because there is no constant period of write operations after which a refresh operation is performed. Instead, the refresh operation is performed based on a random or pseudo-random number of write operations performed. However, this solution can still impact performance negatively. In particular, performing a refresh operation based on a random or pseudo-random number of write operations has two disadvantages. First, there can be a high probability of very short intervals between refresh operations since performing a refresh operation depends on a randomly or pseudo-randomly generated number. Performing refresh operations in short intervals is unnecessary in mitigating write disturb errors and will lead to a negative impact on performance by performing too many refresh operations in a short amount of time and using up resources. Moreover, this solution can result in a possibility of very long intervals between refresh operations. In this case, not performing refresh operations for long periods of time can increase the probability of write disturb errors and thus increase the risk of data loss of victim memory units.

Aspects of the present disclosure address the above and other deficiencies by providing a memory sub-system that manages write disturb for units of memory in a memory device using a randomized refresh period. In certain embodiments, a unit of memory can be one memory cell or a group of adjacent or proximate memory cells within the memory device. In one embodiment, the memory sub-system controller can detect a write operation being performed on an aggressor memory unit. In response to detecting the write operation, the memory sub-system controller can increment a counter that it maintains to track the number of write operations to the aggressor memory unit. The memory sub-system controller can identify a range of numbers with an upper limit and a lower limit (e.g., 500 to 524). The memory sub-system controller can identify (e.g., generate) a random or pseudo-random number within the range of numbers (e.g., 512). The memory sub-system controller can set a threshold criterion to be based on the random or pseudo-random number (e.g., the threshold criterion is 512 write operations). The memory sub-system controller can determine whether the counter satisfies the threshold criterion. If a value of the counter satisfies the threshold criterion, the memory sub-system controller can perform a refresh operation on victim memory units of the aggressor memory unit. Once the refresh operation is performed, the memory sub-system controller can reset the counter to an initial value and identify a new random or pseudo-random number within the range of numbers.

Advantages of the present disclosure include, but are not limited to, managing write disturb on units of a memory device of a memory sub-system without a decrease in performance. As discussed herein above, the current solutions in conventional memory sub-systems for write disturb can lead to other performance issues. In particular, there is a risk of oscillating behavior, short refresh intervals between refresh operations, and long refresh intervals between refresh operations, all of which can negatively affect the performance of the memory sub-system as discussed above. Unlike in existing solutions, aspects of the present disclosure enable the memory sub-system to perform refresh operations at random periods instead of at a constant period, so there is no risk of oscillating behavior in the memory device. Furthermore, since the memory sub-system can perform refresh operations based on a random number constrained within a defined range of numbers, there is no risk of very short refresh intervals or long refresh intervals because the random number will always be within the defined range of numbers. Therefore, aspects of the present disclosure mitigate write disturb errors and improve performance of the memory sub-system.

Figure 1:
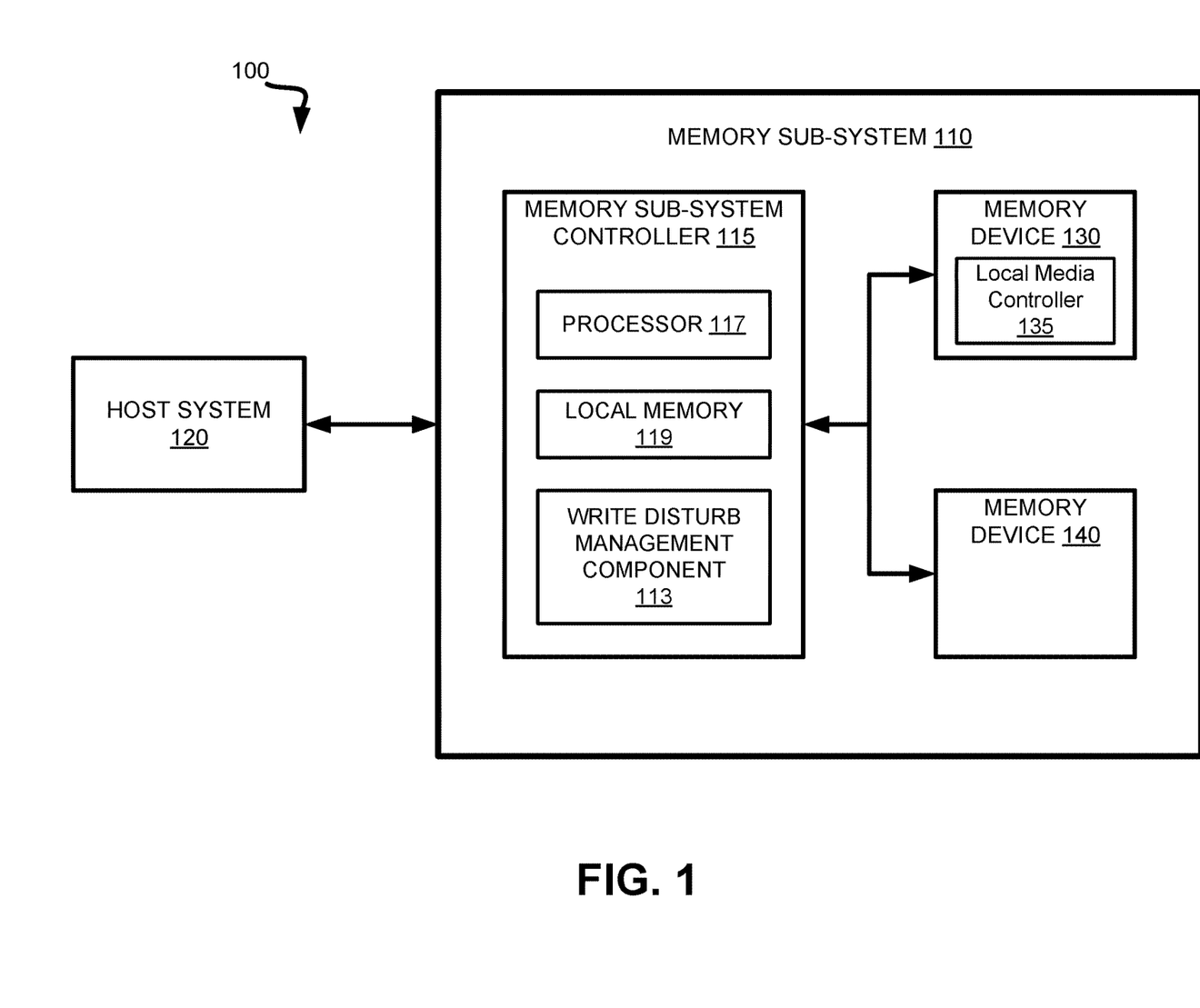
FIG. 1 illustrates an example computing system that includes a memory sub-system in accordance with some embodiments of the present disclosure.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDEVIMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local media controller 135) on the die and a controller (e.g., memory sub-system controller 115) for media management within the same memory device package. An example of a managed memory device is a managed NAND (MNAND) device.

The memory sub-system 110 includes a write disturb management component 113 that can manage write disturb for units of memory of memory devices (e.g., the memory device 130). In some embodiments, the memory sub-system controller 115 includes at least a portion of the write disturb management component 113. In some embodiments, the write disturb management component 113 is part of the host system 110, an application, or an operating system. In other embodiments, local media controller 135 includes at least a portion of write disturb management component 113 and is configured to perform the functionality described herein.

The write disturb management component 113 can detect a write operation being performed on a memory unit. In response to detecting the write operation, the memory sub-system can increment a counter that it maintains to track the number of write operations to the memory unit. The write disturb management component 113 can determine an average number of write operations performed on the memory unit before neighboring (e.g., adjacent or proximate) memory units experience write disturb effect. The average number of write operations can be based on media characterization. The write disturb management component 113 can identify a range of numbers with an upper limit and a lower limit (e.g., 500 to 524). The range of numbers can be within a margin (e.g., 10%, 20%, etc.) of the average number of write operations. The write disturb management component 113 can identify (e.g., generate) a random or pseudo-random number within the range of numbers (e.g., 512). The write disturb management component 113 can set a threshold criterion based on the random or pseudo-random number (e.g., the threshold criterion is 512 write operations). The write disturb management component 113 can determine whether the counter satisfies the threshold criterion. If a value of the counter satisfies the threshold criterion, the write disturb management component 113 can perform a refresh operation on the neighboring memory units of the memory unit. Once the refresh operation is performed, the write disturb management component 113 can reset the counter to an initial value and identify a new random or pseudo-random number within the range of numbers. Further details with regards to the operations of the write disturb management component 113 are described below.

Figure 2A:
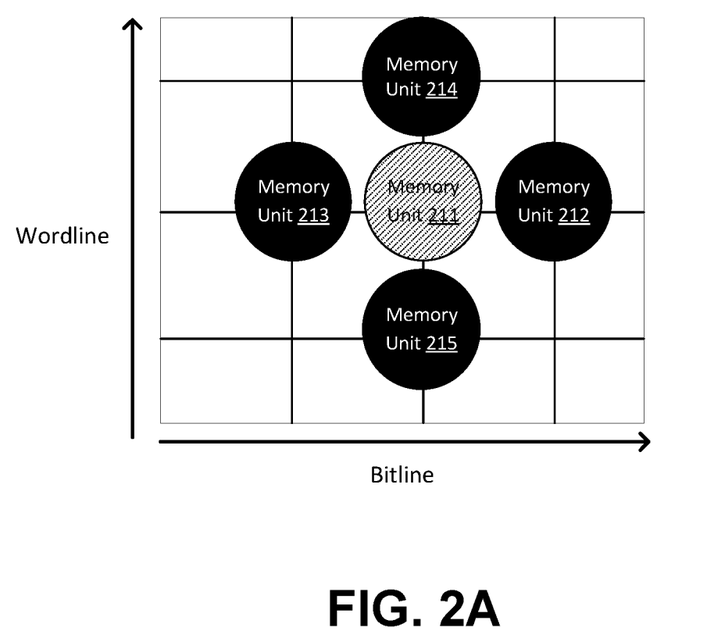
FIG. 2A illustrates an example memory unit causing a write disturb effect on adjacent memory units of a memory device, in accordance with some embodiments of the present disclosure.

FIG. 2A illustrates an example memory unit causing a write disturb effect on adjacent memory units of a memory device, in accordance with embodiments of the disclosure. In one implementation, a memory unit 211 is adjacent to a memory unit 214 and a memory unit 215 vertically. Memory unit 211 is also adjacent to a memory unit 212 and a memory unit 213 horizontally. In one implementation, the memory device can include a shared bitline having a number of pillars extending to a separate source line. Each pillar can be a vertical conductive trace and the intersections of each pillar and each wordline forms a memory unit (e.g., a memory cell). In this case, each memory unit has four adjacent neighboring memory units abutting its bitline-wordline intersection from the north, east, south, and west directions.

In some implementations, when a write operation is performed to memory unit 211, the voltage stage of each neighboring memory unit is altered, thus eventually resulting in a degree of distortion of data of the neighboring memory units. In this case, memory unit 211 can be referred to as an aggressor, and its neighboring memory units 212-215 can be referred to as victims. In certain implementations, distortion of data of the victim memory units 212-215 can result in data loss as explained above. Accordingly, a refresh operation may be performed on each victim memory unit 212-215 where data stored at each memory unit 212-215 is read, an error correction operation is performed on the data, and then the data is written back to the same memory units 212-215, thus overcoming the effect of the write disturb caused by the aggressor memory unit 211.

Figure 2B:
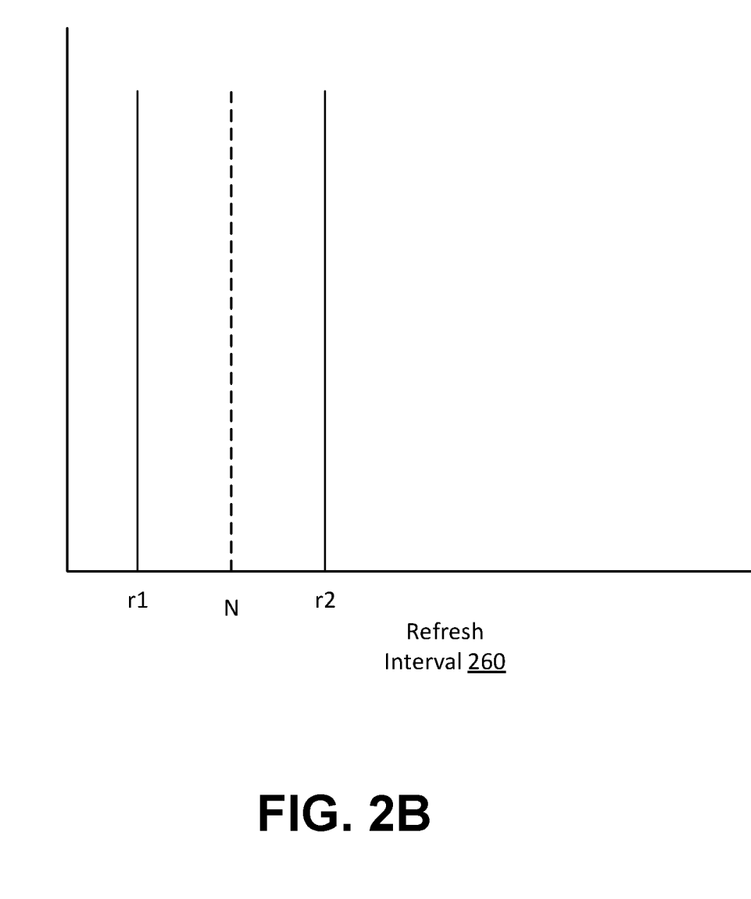
FIG. 2B illustrates an example diagram of a defined refresh interval range, in accordance with some embodiments of the present disclosure.

FIG. 2B illustrates an example diagram of a defined refresh interval range, in accordance with some embodiments of the present disclosure. A write disturb management component (e.g., the write disturb management component 113 of FIG. 1) can identify a refresh interval (i.e., a range of numbers) with an upper limit and a lower limit. The write disturb management component 113 can identify the refresh interval by determining an average number of write operations performed on the memory unit before neighboring (e.g., adjacent or proximate) memory units experience write disturb effect. The refresh interval can be within a margin (e.g., 10%, 20%, etc.) of the average number of write operations. For example, in FIG. 2B, the write disturb management component can identify a refresh interval 260 with a lower limit, r1, and an upper limit, r2. The lower limit, r1, can be equal to 500 write operations, and the upper limit, r2, can be equal to 524 write operations. The write disturb management component 113 can identify (e.g., generate) a random or pseudo-random number N within the range of numbers (e.g., 512). The random or pseudo-random number N will be constrained between r1 and r2. As discussed above, constraining the random or pseudo-random number N within r1 and r2 can prevent oscillating behavior and reduce the probability of short or long refresh intervals. Further details with regards to the operations of the write disturb management component 113 are described below.

Figure 3:
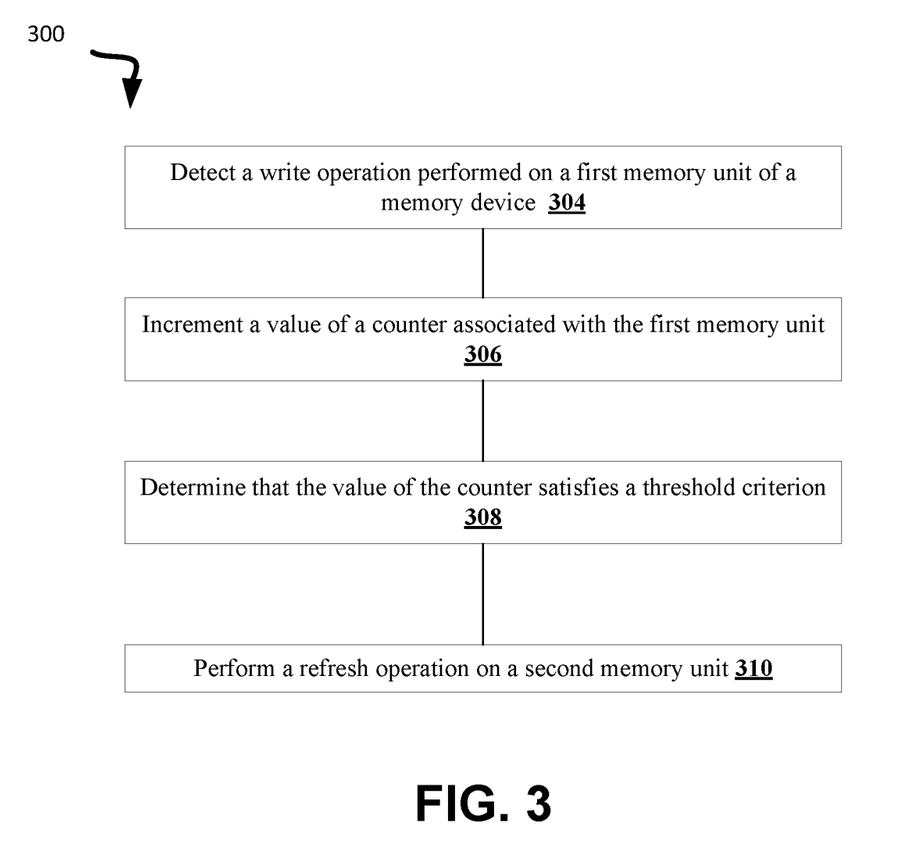
FIG. 3 is a flow diagram of an example method to manage write disturb for memory units of a memory device, in accordance with some embodiments of the present disclosure.

FIG. 3 is a flow diagram of an example method 300 to mitigate write disturb on units of memory of a memory device, in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the write disturb management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 304, the processing logic detects a write operation performed on a memory unit of the memory device. The memory unit can include one or more memory cells of the memory device. The memory unit can also be referred to as an "aggressor" memory unit. The aggressor memory unit can be neighboring to (e.g., adjacent to, proximate to, next to, etc.) one or more other memory units of the memory device. In some embodiments, the one or more other memory units can receive a write disturb effect as a result of the write operation performed on the aggressor memory unit of the memory device. The one or more other memory units can also be referred to as a "victim" memory unit.

At operation 306, the processing logic increments a value of a counter associated with the memory unit. In some embodiments, the processing logic increments (e.g., by 1) the value of the counter in response to detecting the write operation. In some embodiments, the value of the counter can correspond to a number of occurrences of write operations to the memory unit. In some embodiments, the processing logic stores the value of the counter in a data structure (e.g., a table) associated with the memory unit and/or memory device. The data structure can be used to store metadata associated with the memory unit and/or memory device. In some embodiments, incrementing the value of the counter associated with the memory unit can include updating an entry associated with the counter in the data structure. In some embodiments, the processing logic can maintain a counter for each memory unit of the memory device. In some embodiments, the processing logic can maintain a global counter for the memory device as a whole.

At operation 308, the processing logic determines that the value of the counter satisfies a threshold criterion. In some embodiments, the processing logic can define a range of numbers with an upper limit and a lower limit. For example, as illustrated in FIG. 2B, the processing logic can define a refresh interval 260 with an upper limit, r2, and a lower limit, r1. In some embodiments, the processing logic determines an average number of write operations performed on the memory unit before the one or more memory units (e.g., the victim memory units) experience write disturb effect. The average number of write operations can be based on media characterization of the memory device. In some embodiments, the processing logic can define the range of numbers to be within a margin (e.g., 10%, 20%, etc.) of the average number of write operations. In some embodiments, the processing logic can generate a random number or a pseudo-random number (e.g., using a random number generator algorithm). The random number or pseudo-random number can be constrained within the defined range of numbers. For example, as illustrated in FIG. 2B, a random or pseudo-random number N can be generated between the upper limit, r2, and the lower limit, r1, of the refresh interval 260. In some embodiments, the processing logic can set the threshold criterion to be equal to the random number or pseudo-random number. In some embodiments, determining that the value of the counter satisfies the threshold criterion includes determining that the value of the counter is greater than or equal to a threshold value associated with the threshold criterion. In some embodiments, the processing logic can determine that the value of the counter does not satisfy the threshold criterion. For example, determining that the value of the counter does not satisfy the threshold criterion can include determining that the value of the counter is less than the threshold value associated with the threshold criterion. In response to determining that the value of the counter does not satisfy the threshold criterion, the processing logic can return to operation 304 as described above and detect another write operation performed on the memory unit.

At operation 310, the processing logic performs a refresh operation on the one or more other memory units. In some embodiments, the one or more other memory units (e.g., the victim memory units) can include one or more memory cells neighboring to (e.g., adjacent to, proximate to, next to, etc.) the aggressor memory unit. In some embodiments, the processing logic performs the refresh operation in response to determining that the value of the counter satisfies the threshold criterion. In some embodiments, performing the refresh operation includes reading data from the one or more other memory units, performing an error correction operation on the data, and writing the data back to the one or more other memory units in order to reset voltage offsets of the one or more memory units as explained in more details herein above. In some embodiments, the processing logic resets the value of the counter to an initial value (e.g., 0) in response to performing the refresh operation on the one or more memory units. Resetting the value of the counter to the initial value can include updating the entry in the data structure associated with the counter with the initial value. In some embodiments, the processing logic identifies (e.g., generates) a new random number or pseudo-random number within the defined range of numbers in respect to performing the refresh operation.

Figure 4:
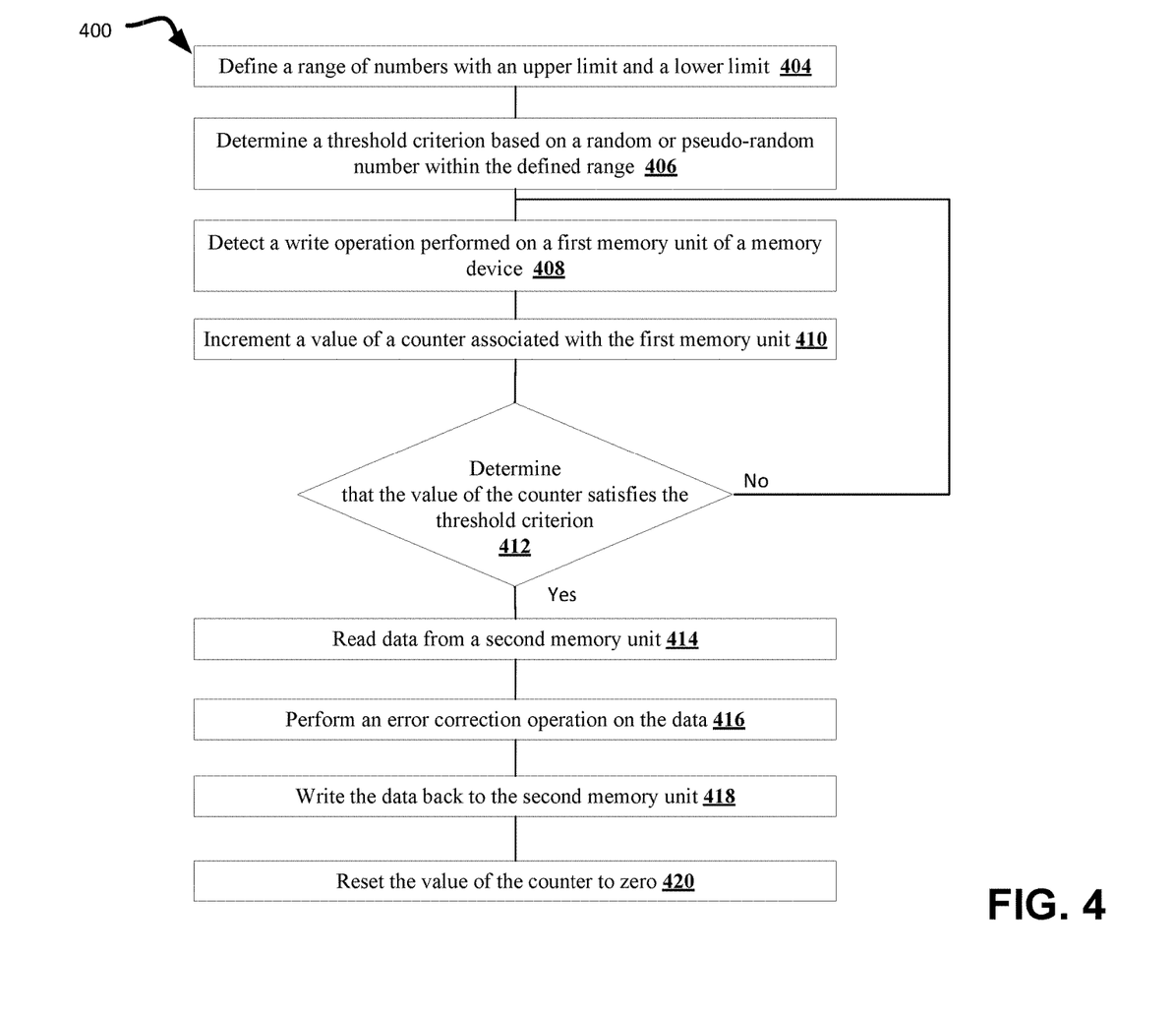
FIG. 4 is a flow diagram of an example method to manage write disturb for memory units of a memory device, in accordance with some embodiments of the present disclosure.

FIG. 4 is a flow diagram of an example method 400 to mitigate write disturb on units of memory of a memory device, in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the write disturb management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 404, the processing logic defines a range of numbers with an upper limit and a lower limit. For example, as illustrated in FIG. 2B, the processing logic can define a refresh interval 260 with an upper limit, r2, and a lower limit, r1. In some embodiments, the processing logic determines an average number of write operations performed on a memory unit of the memory device before neighboring (e.g., adjacent, proximate, etc.) one or more memory units experience write disturb effect. The average number of write operations can be based on media characterization of the memory device. In some embodiments, the processing logic can define the range of numbers to be within a margin (e.g., 10%, 20%, etc.) of the average number of write operations. In some embodiments, the processing logic can generate a random number or a pseudo-random number (e.g., using a random number generator algorithm). The random number or pseudo-random number can be constrained within the defined range of numbers. For example, as illustrated in FIG. 2B, a random or pseudo-random number N can be generated between the upper limit, r2, and the lower limit, r1, of the refresh interval 260.

At operation 406, the processing logic determines a threshold criterion based on the random number or pseudo-random number. In some embodiments, determining the threshold criterion can include setting the threshold criterion equal to the random number or pseudo-random number.

At operation 408, the processing logic detects a write operation performed on the memory unit of the memory device. The memory unit can include one or more memory cells of the memory device. The memory unit can also be referred to as an "aggressor" memory unit. The aggressor memory unit can be neighboring to (e.g., adjacent to, proximate to, next to, etc.) one or more other memory units of the memory device. In some embodiments, the one or more other memory units can receive a write disturb effect as a result of the write operation performed on the aggressor memory unit of the memory device. The one or more other memory units can also be referred to as a "victim" memory unit.

At operation 410, the processing logic increments a value of a counter associated with the memory unit. In some embodiments, the processing logic increments (e.g., by 1) the value of the counter in response to detecting the write operation. In some embodiments, the value of the counter can correspond to a number of occurrences of write operations to the memory unit. In some embodiments, the processing logic stores the value of the counter in a data structure (e.g., a table) associated with the memory unit and/or memory device. The data structure can be used to store metadata associated with the memory unit and/or memory device. In some embodiments, incrementing the value of the counter associated with the memory unit can include updating an entry associated with the counter in the data structure. In some embodiments, the processing logic can maintain a counter for each memory unit of the memory device. In some embodiments, the processing logic can maintain a global counter for the memory device as a whole.

At operation 412, the processing logic determines that the value of the counter satisfies the threshold criterion. In some embodiments, determining that the value of the counter satisfies the threshold criterion includes determining that the value of the counter is greater than or equal to a threshold value associated with the threshold criterion. In some embodiments, the processing logic can determine that the value of the counter does not satisfy the threshold criterion. For example, determining that the value of the counter does not satisfy the threshold criterion can include determining that the value of the counter is less than the threshold value associated with the threshold criterion. In response to determining that the value of the counter does not satisfy the threshold criterion, the processing logic can return to operation 408 as described above and detect another write operation performed on the memory unit.

At operation 414, the processing logic reads data from one or more other memory units. In some embodiments, reading data from the one or more other memory units can be part of a refresh operation performed on the one or more other memory units. In some embodiments, the one or more other memory units (e.g., the victim memory units) can include one or more memory cells neighboring to (e.g., adjacent to, proximate to, next to, etc.) the aggressor memory unit.

At operation 416, the processing logic performs an error correction operation on the data from the one or more other memory units. In some embodiments, performing the error correction operation on the data can be part of the refresh operation performed on the one or more other memory units.

At operation 418, the processing logic writes the data back to the one or more other memory units. In some embodiments, writing the data back to the one or more other memory units can be part of the refresh operation performed on the one or more other memory units.

At operation 420, the processing logic resets the value of the counter to an initial value (e.g., zero). In some embodiments, the processing logic resets the value of the counter to the initial value in response to performing the refresh operation on the one or more memory units. Resetting the value of the counter to zero can include updating the entry in the data structure associated with the counter with the initial value. In some embodiments, the processing logic identifies (e.g., generates) a new random number or pseudo-random number within the defined range of numbers in respect to performing the refresh operation.

Figure 5:
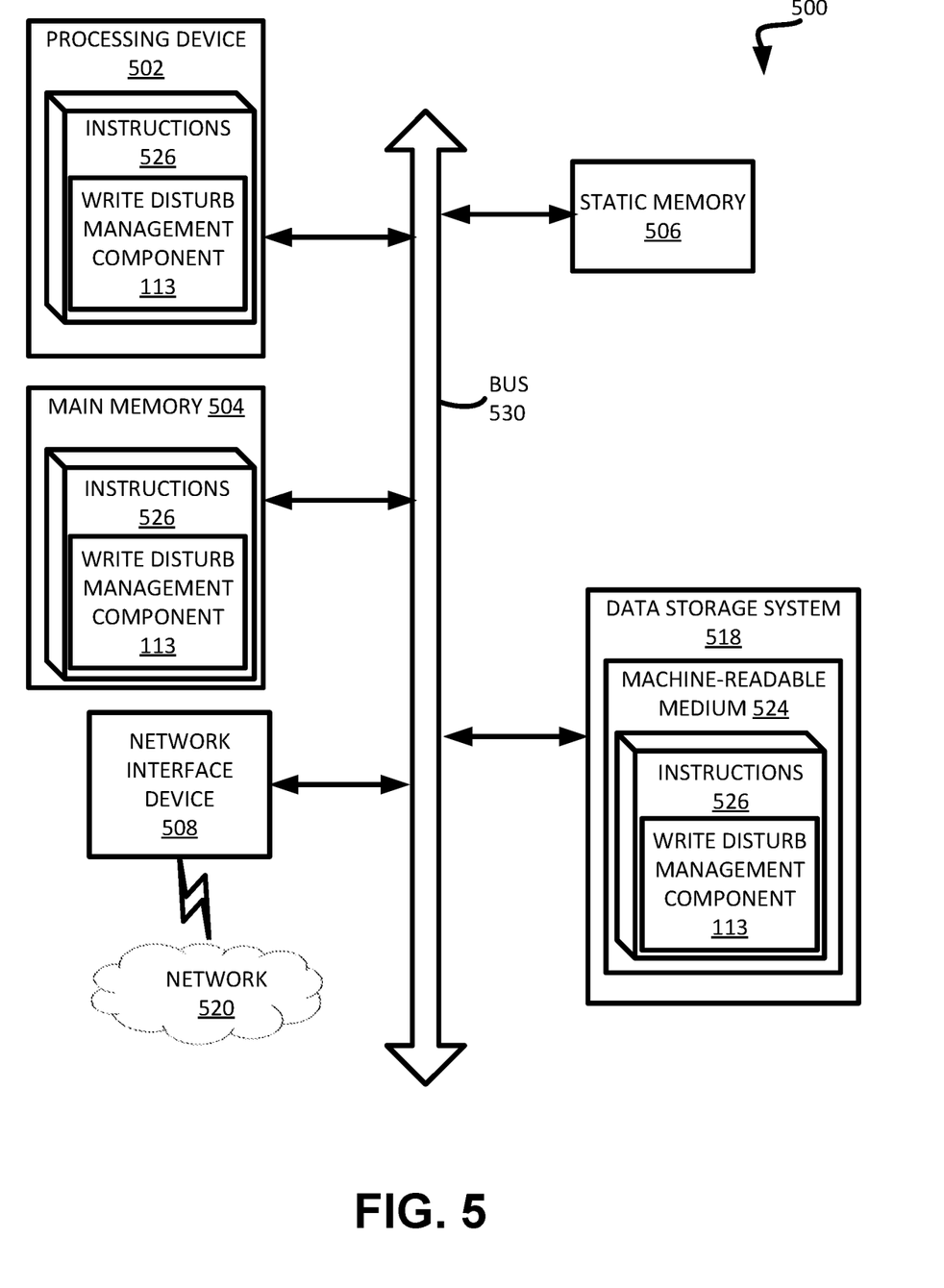
FIG. 5 is a block diagram of an example computer system in which embodiments of the present disclosure may operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the write disturb management component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or RDRAM, etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 604 can correspond to the memory sub-system 110 of FIG. 1.

In one embodiment, the instructions 526 include instructions to implement functionality corresponding to a write disturb management component (e.g., the write disturb management component 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory device; and
a processing device, operatively coupled with the memory device, to perform operations comprising:
detecting a write operation performed on a first memory unit of the memory device, wherein the first memory unit comprises one or more memory cells;
responsive to detecting the write operation, incrementing a value of a counter associated with the first memory unit;
determining that the value of the counter satisfies a threshold criterion, wherein the threshold criterion is based on a random or pseudo-random number within a defined range; and
responsive to determining that the value of the counter satisfies the threshold criterion, performing a refresh operation on a second memory unit.

2. The system of claim 1, further comprising:
responsive to performing the refresh operation on the second memory unit, resetting the value of the counter to an initial value.

3. The system of claim 1, wherein performing the refresh operation comprises:
reading data from the second memory unit;
performing an error correction operation on the data; and
writing the data back to the second memory unit.

4. The system of claim 1, wherein the second memory unit comprises one or more memory cells adjacent to the one or more memory cells of the first memory unit.

5. The system of claim 1, wherein the defined range comprises a set of values having an upper limit and a lower limit.

6. The system of claim 1, wherein the value of the counter corresponds to a number of occurrences of write operations to the first memory unit.

7. The system of claim 1, wherein the value of the counter is stored in a data structure associated with the memory device.

8. A method comprising:
detecting a write operation performed on a first memory unit of a memory device, wherein the first memory unit comprises one or more memory cells;
responsive to detecting the write operation, incrementing a value of a counter associated with the first memory unit;
determining that the value of the counter satisfies a threshold criterion, wherein the threshold criterion is based on a random or pseudo-random number within a defined range; and
responsive to determining that the value of the counter satisfies the threshold criterion, performing a refresh operation on a second memory unit.

9. The method of claim 8, further comprising:
responsive to performing the refresh operation on the second memory unit, resetting the value of the counter to an initial value.

10. The method of claim 8, wherein performing the refresh operation comprises:
reading data from the second memory unit;
performing an error correction operation on the data; and
writing the data back to the second memory unit.

11. The method of claim 8, wherein the second memory unit comprises one or more memory cells adjacent to the one or more memory cells of the first memory unit.

12. The method of claim 8, wherein the defined range comprises a set of values having an upper limit and a lower limit.

13. The method of claim 8, wherein the value of the counter corresponds to a number of occurrences of write operations to the first memory unit.

14. The method of claim 8, wherein the value of the counter is stored in a data structure associated with the memory device.

15. A non-transitory computer-readable storage medium comprising instructions that, when executed by a processing device, cause the processing device to perform operations comprising:
defining a range of numbers with an upper limit and a lower limit;
determining a threshold criterion based on a random or pseudo-random number within the defined range;
detecting a write operation performed on a first memory unit of a memory device, wherein the first memory unit comprises one or more memory cells;
responsive to detecting the write operation, incrementing a value of a counter associated with the first memory unit;
determining that the value of the counter satisfies the threshold criterion; and
responsive to determining that the value of the counter satisfies the threshold criterion, performing a refresh operation on a second memory unit.

16. The non-transitory computer-readable storage medium of claim 15, wherein the processing device is to perform operations further comprising:
responsive to performing the refresh operation on the second memory unit, resetting the value of the counter to an initial value.

17. The non-transitory computer-readable storage medium of claim 15, wherein performing the refresh operation comprises:
reading data from the second memory unit;
performing an error correction operation on the data; and
writing the data back to the second memory unit.

18. The non-transitory computer-readable storage medium of claim 15, wherein the second memory unit comprises one or more memory cells adjacent to the one or more memory cells of the first memory unit.

19. The non-transitory computer-readable storage medium of claim 15, wherein the value of the counter corresponds to a number of occurrences of write operations to the first memory unit.

20. The non-transitory computer-readable storage medium of claim 15, wherein the value of the counter is stored in a data structure associated with the memory device.

* * * * *